United States Patent
Ahl et al.

[11] Patent Number: 6,160,710
[45] Date of Patent: *Dec. 12, 2000

[54] CAPACITIVE MOUNTING ARRANGEMENT FOR SECURING AN INTEGRATED CIRCUIT PACKAGE TO A HEAT SINK

[75] Inventors: Bengt Ahl, Gavle, Sweden; Larry C. Leighton, Scottsdale, Ariz.; Thomas W. Moller, Gilroy, Calif.

[73] Assignee: Ericsson Inc., Morgan Hill, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/054,972

[22] Filed: Apr. 3, 1998

[51] Int. Cl.[7] ........................................ H05K 7/20
[52] U.S. Cl. .................... 361/707; 257/727; 361/719; 439/73
[58] Field of Search .................. 24/455, 486; 403/408.1; 257/698, 699, 774, 718, 719, 726, 727; 267/150, 158, 160; 248/500, 505, 510; 165/80.3, 185; 174/16.3, 252; 361/761, 704, 707, 709, 710, 713, 717–719, 306.3, 321.2; 439/72, 73, 801, 883, 331

[56] References Cited

U.S. PATENT DOCUMENTS

| | | | |
|---|---|---|---|
| 3,801,874 | 4/1974 | Stefani | 361/707 |
| 3,874,768 | 4/1975 | Cutchaw . | |
| 4,495,515 | 1/1985 | Pamiello | 357/81 |
| 4,658,331 | 4/1987 | Berg . | |
| 4,724,514 | 2/1988 | Kaufman | 361/388 |
| 5,237,485 | 8/1993 | Martiis | 361/712 |
| 5,262,925 | 11/1993 | Matta | 439/73 |
| 5,267,867 | 12/1993 | Agahdel | 439/73 |
| 5,291,063 | 3/1994 | Adishian | 361/707 |
| 5,307,236 | 4/1994 | Rio | 361/720 |
| 5,730,210 | 3/1998 | Kou | 361/704 |
| 5,869,897 | 2/1999 | Leighton et al. . | |

FOREIGN PATENT DOCUMENTS

| | | | |
|---|---|---|---|
| 94 03 108 | 4/1994 | Germany | H01L 25/11 |
| 02021642 | 1/1990 | Japan | H01L 23/40 |
| 08288614 | 11/1996 | Japan | H05K 1/18 |
| 2084796 | 9/1981 | United Kingdom | H01L 23/34 |

*Primary Examiner*—Gerald Tolin
*Attorney, Agent, or Firm*—Lyon & Lyon LLP

[57] ABSTRACT

A thermally conductive mounting flange of an IC package is placed directly on a heat sink surface between respective sections of single layer PC board attached to the heat sink, such that electrical leads extending from opposing sides of the package are positioned over corresponding conductive areas formed on the surface of the respective adjacent PC board section. The leads are electrically coupled with the conductive areas by respective tie-down screws fastened through dielectric isolating washers. The screws are tightened sufficiently against the isolating washers so as to press the respective package leads into solid electrical contact with the conductive areas. Portions of the respective leads and conductive areas surrounding the tie-down screws are cut-away to prevent electrical contact, in order to avoid shorting the leads and/or conductive areas to the heat sink via the tie-down screws. Alternately, respective ends of a retaining spring used to secure the IC package to the heat sink mounting flange are also secured by the package lead tie-down screws, such that the screws both secure the package against the heat sink and press the package leads into solid electrical contact with the respective conductive areas.

5 Claims, 4 Drawing Sheets

CAPACITIVE MOUNTING ARRANGEMENT FOR SECURING AN INTEGRATED CIRCUIT PACKAGE TO A HEAT SINK

FIELD OF THE INVENTION

The present invention pertains to the field of integrated circuit packages and, in particular, to mounting arrangements for securing an integrated circuit package to a heat sink.

BACKGROUND

Integrated circuits ("ICs") have many uses in industries ranging from communications to consumer electronics. By way of example, a power transistor IC is formed by fabricating one or more transistor cells on a silicon wafer, commonly referred to as a transistor "chip". The transistor chip is attached to an isolating layer, normally a ceramic substrate, which is thermally, but not electrically, conductive. The ceramic substrate is itself attached to a thermally conductive mounting flange. A protective cover is secured to the flange, covering the substrate and transistor chip, thereby forming a power transistor IC "package."

Various electrically conductive (e.g., thin metal) leads may be attached to, and extend away from the package, in order to connect common terminals of the transistor chip to other circuit elements located, e.g., on an adjacent printed circuit ("PC") board. For example, with a bipolar junction type power transistor, respective electrical leads attached to the package are connected to a base, emitter and collector of the transistor chip.

Because the power transistor package generates a significant amount of heat during operation, the bottom surface of the package mounting flange is normally directly secured to a metallic heat sink underlying the PC board. For example, a single layer PC board has a layer of dielectric material between respective top and bottom conductive surfaces, wherein the bottom surface acts as a reference ground. This bottom surface is connected, usually with screws or solder, to the underlying metal heat sink, so that the bottom surface and the heat sink have the same ground potential with respect to any circuit elements attached to the top surface of the PC board.

There are several known techniques for securing an IC package to a heat sink surface. For example, as illustrated in FIG. 1, an exemplary IC package 20 may be secured to a heat sink 22 by a solder connection 28 between the bottom surface of the package mounting flange 26 and the surface of the heat sink 22.

While this approach is relatively simple, the solder weld material 28 will invariably have a different thermal expansion coefficient than the respective (typically metal) mounting flange 26 and heat sink 22. As a result, the bond between the mounting flange 26 and heat sink 22 will weaken or even be destroyed by the thermal expansion stress between the respective layers, especially when subjected to repeated changes in temperature during each use of the IC package 20. Further, the presence of the intervening bonding material layer 28 may lesson the effectiveness of the heat conduction between the flange 26 and heat sink 22. A still further disadvantage with this approach is that, in order to remove the IC package 20 for repair or replacement, the entire heat sink 22 must be heated to break the solder bond 28, thereby causing any other solder bonds on the same heat sink 22 to be weakened.

Referring to FIG. 2, as an alternative to using a solder connection, the IC package 20 may be secured to the heat sink 22 with a pair of screws 24 through openings located on respective ends of the mounting flange 26. Referring to FIGS. 3 and 4, still another technique for securing an IC package to a heat sink is to insert one or more screws 30 into, so as to be protruding above, the surface of the heat sink 22. A resilient metal strip 32 is extended from the screw(s) 30 and is shaped so as to apply a clamping force upon the cover of the IC package 20, thereby distributing a substantially centered force that "secures" the mounting flange 26 against the heat sink 22.

Still another method for securing an IC package to a heat sink is disclosed and described in now U.S. Pat. No. 5,869,897, "Mounting Arrangement For Securing An Integrated Circuit Package To A Heat Sink," which is fully incorporated herein by reference for all it teaches. As taught therein, and as illustrated in FIG. 5, a top surface 52 of a protective cover 50 of an IC component package 40 is provided with a centered-protrusion 54. A resilient retaining-spring 46 formed into a ribbon-like shape having opposing ends 56 and 58 that extend from a curvelinear bottom surface 60 is provided with an opening 62 sized to mate with the centered protrusion 54.

To mount the IC package 40 to a heat sink 42, the retaining-spring opening 62 is compressively mated onto the package cover protrusion 54 as the mounting flange 45 of the IC package 40 is inserted between substantially parallel walls 44 and 48 protruding from the heat sink 42, such that the opposing retaining-spring ends 56 and 58 extend away from the package cover 50 at substantially the same, albeit reverse angles. The walls 44 and 48 are distanced from each other just so as to cause moderate compression of the opposing retaining-spring ends 56 and 58 toward each other as the flange 45 is inserted against the heat sink 42.

The walls 44 and 48 are each provided with a respective plurality of notches 64 and 68, which extend substantially parallel to the heat sink 42 in a "ratchet-type" relief pattern. Once the mounting flange 45 is pressed against the heat sink 42, the opposing spring ends 56 and 58 are retained in place by the respective wall notches 64 and 68. In this manner, the spring 46 applies a retaining force against the package cover 50, thereby securing the mounting flange 45 against the heat sink 42, as indicated by the arrow 70.

With any of the above-illustrated methods for securing an IC package to a heat sink, once the IC package is secured to the heat sink, electrical leads extending from the package (not shown in FIGS. 1–5) must be connected to respective conductive surface leads or areas, e.g., located on an adjacent PC board attached to the heat sink.

By way of illustration, referring to FIG. 6, the mounting flange 86 of an IC package 80 is mounted on a heat sink 82 via a conventional solder weld 84. A single layer PC board 88 is also secured to the heat sink 82, e.g., by screws (not shown) adjacent both sides of the package 80. The PC board includes a metal top surface 90, a layer of dielectric material 92, and a metal bottom surface 94, respectively, wherein the bottom surface 94 and attached heat sink 82 collectively act as a reference ground with respect to circuit elements (not shown) attached to the top surface of the PC board 88. Respective leads 96 and 98 extend from opposite sides of the package 80 and are connected to corresponding conductive paths formed on the top surface 90 of the PC board 88 via respective solder welds 100 and 102.

As with the problems of using a solder weld connection between the respective package flange (28) and heat sink (22) described above in conjunction with FIG. 1, the solder weld connections 100 and 102 are also prone to problems caused by different thermal expansion coefficients between the solder material, the conductive surface 90, and the respective (metal) leads 96 and 98. In particular, the solder material can crystallize after repeated heating and cooling, causing welds 100 and 102 to weaken and/or fail, with the respective leads 96 and 98 lifting and separating from the surface 90 of the PC board 88.

Thus, it would be desirable to provide improved arrangements for securing an IC component package to a heat sink, whereby solder-welds are eliminated.

SUMMARY OF THE INVENTION

The present invention provides improved arrangements for securing an IC component package to a heat sink in a manner which provides for the non-solder-based connection of leads extending from the package to respective conductive pathways located on an adjacent PC board surface.

In a preferred embodiment, a thermally conductive mounting flange of an IC package is placed directly on a heat sink surface between respective sections of single layer PC board attached to the heat sink, such that electrical leads extending from opposing sides of the package are positioned over corresponding conductive areas formed on the surface of the respective adjacent PC board section. In accordance with a general aspect of the present invention, the leads are electrically coupled with the conductive areas by respective tie-down screws.

In particular, a first tie-down screw is fastened through a first isolating washer, the first package lead and the first conductive area, respectively, into the heat sink. A second tie-down screw is fastened through a second isolating washer, the second package lead and the second conductive area, respectively, into the heat sink. The first and second isolating washers are preferably a sutiable dielectric material.

The screws are tightened sufficiently against the isolating washers so as to press the respective package leads into solid electrical contact with the conductive areas. Portions of the respective leads and conductive areas surrounding the tie-down screws are cut-away to prevent electrical contact, in order to avoid shorting the leads and/or conductive areas to the heat sink via the tie-down screws.

In an alternate preferred embodiment, respective ends of a retaining spring used to secure the IC package to the heat sink mounting flange are also secured by the package lead tie-down screws, such that the screws both secure the package against the heat sink and press the package leads into solid electrical contact with the respective conductive areas.

Thus, a general object of the invention is to eliminate the need for solder-based connections of the IC package leads to the respective conductive areas, thereby decreasing thermal stresses and strains on the leads. A further advantage is that the dielectric isolating washers, in conjunction with the respective tie-down screws and package leads, act as a pair of capacitors, which help match the imedance between the respective package leads and conductive PC board areas.

As will be apparent to those skilled in the art, other and further objects and advantages will appear hereinafter.

BRIEF DESCRIPTION OF THE DRAWINGS

The drawings illustrate both the design and utility of the present invention, in which similar elements in different embodiments are referred to by the same reference numbers for purposes of ease in illustration, in which.

DETAILED DESCRIPTION OF THE PREFERRED EMBODIMENTS

Figure 1:
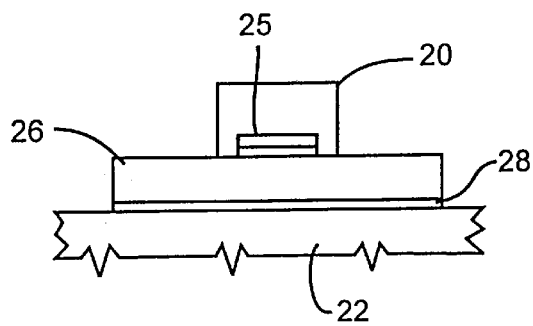
FIG. 1 is a side view of a first prior art mounting arrangement, wherein an IC package is soldered or otherwise bonded to a heat sink.
Figure 2:
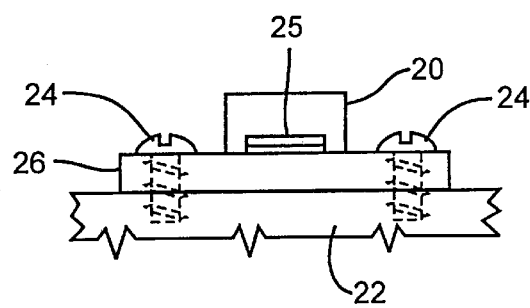
FIG. 2 is a partial cut-away side view of a second prior art mounting arrangement, wherein mounting screws are employed for directly attaching an IC package to a heat sink.
Figure 3:
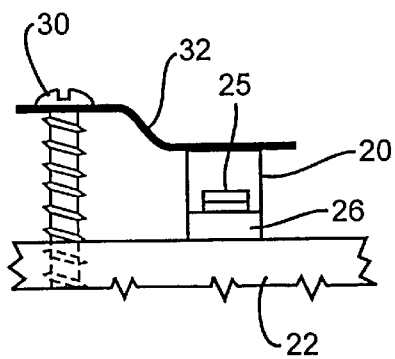
FIG. 3 is a side view of a third prior art mounting arrangement, wherein a single retaining screw and retaining strip extending therefrom are used to secure an IC package to a heat sink.
Figure 4:
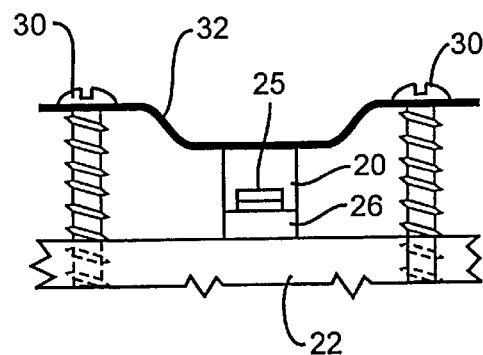
FIG. 4 is an side view of a fourth prior art mounting arrangement, wherein a pair of retaining screws and a retaining strip extended therebetween are used to secure an IC package to a heat sink.
Figure 5:
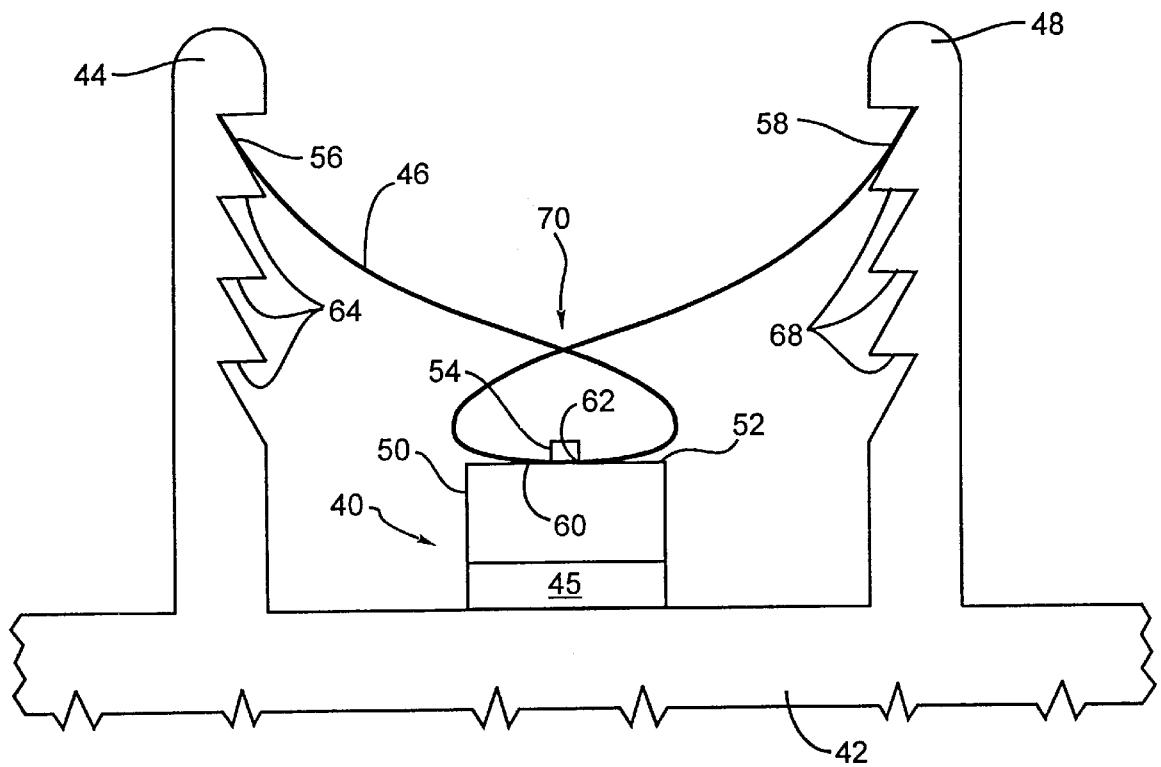
FIG. 5 is a partial cut-away side view of a still further arrangement for mounting an IC package to a heat sink, wherein a resilient, ribbon-shaped retaining-spring is affixed to the center of a protective cover of the package and held in place by a pair of opposing walls protruding from the heat sink.
Figure 6:
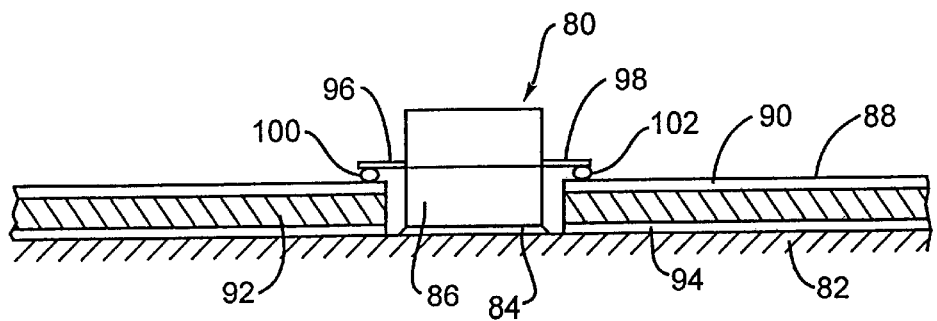
FIG. 6 is a partial cut-away side view of an IC package solder bonded to a heat sink, whereby conductive surface leads on an adjacent PC board are connected to respective leads extending from the package via a prior art solder weld connections.
Figure 7:
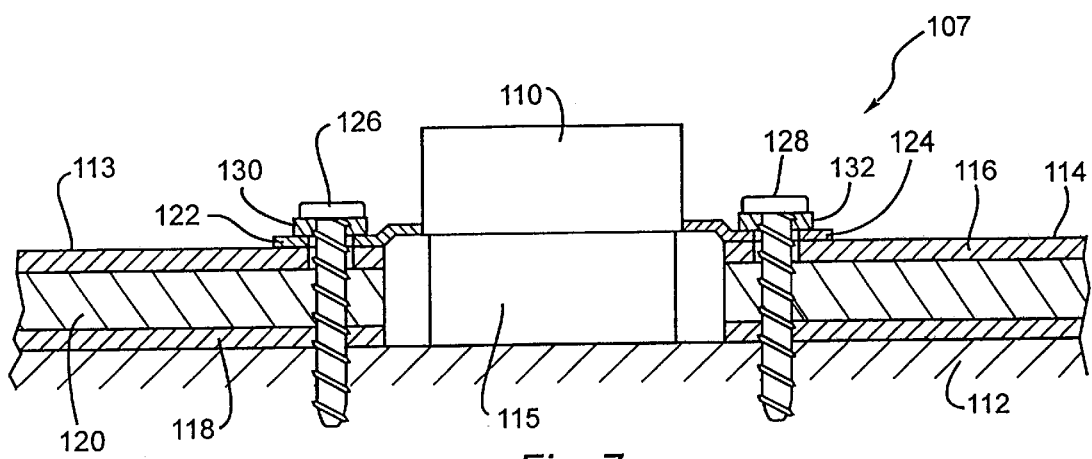
FIG. 7 is a partial cut-away side view of a first preferred electrical assembly, including an IC package secured to a heat sink in accordance with the present invention.

Referring to FIG. 7, as part of a preferred electrical assembly 107, a mounting flange 115 underlying a power transistor package 110 is positioned on a heat sink 112 between first and second sections 113 and 114 of single layer PC board attached to the heat sink 112. The respective PC board sections 113 and 114 each comprise a conductive metal top surface 116, a middle layer of dielectric material 120, and a conductive metal bottom surface 118, respectively, with the bottom surface 118 and attached heat sink 112 collectively acting as a reference ground with respect to circuit elements (not shown) attached to the conductive top surface 116.

The power transistor package 110 includes a first electrical lead 122 extending over the top surface 116 of the first PC board section 113, and a second electrical lead 124 extending over the top surface 116 of the second PC board section 114. The package leads 122 and 124 are electrically coupled with the conductive surface 116 of the respective PC board sections 113 and 114 by respective tie-down screws 126 and 128.

In particular, tie-down screw 126 is fastened through a first dielectric isolating washer 130, the first package lead 122 and the first PC board section 113, respectively, into the heat sink 112. The tie-down screw 128 is fastened through a second dielectric isolating washer 132, the second package lead 124 and the second PC board section 114, respectively, into the heat sink 112. The screws 126 and 128 are preferably tightened sufficiently against the isolating washers 130 and 132 so that washers press the respective package leads 122 and 124 into solid electrical contact with the conductive top surface 116 of the respective PC board sections 113 and 114.

The package leads 122 and 124 and the conductive top surface 116 of the PC board sections 113 and 114 surrounding the respective screws 126 and 128 are cut-away to prevent electrical contact in order to avoid shorting the leads 122/124 and/or the conductive top surface 116 to the heat sink 112 via the screws 126/128. The isolating washers 130 and 132 are preferably made of a good thermal conductor in order to allow for heat from the package leads 122 and 124 to dissipate into the heat sink 112 via the respective screws 126 and 128. Examples of such materials include dielectrics like beryllium oxide and aluminum nitride.

An advantage of the package lead connection employed in assembly 107 is that solder connections between the respective package leads 122 and 124 and the conductive surface 116 of the PC board sections 113 and 114 are eliminated, thereby decreasing thermal stresses and strains on the leads.

A further advantage is that the dielectric isolating washers 130 and 132, in conjunction with the respective screws 126/128 and package leads 122/124, provide a pair of capacitors to help match the impedance between the package leads 122/124 and the respective conductive surface 116 areas. Notably, depending on the stiffness of the dielectric isolating washers 130/132, the screws 126 and 128 could each act as a trimmer to adjust the capacitance of the respective washers 130/132—i.e., by the relative tightening of the respective screw.

Figure 8:
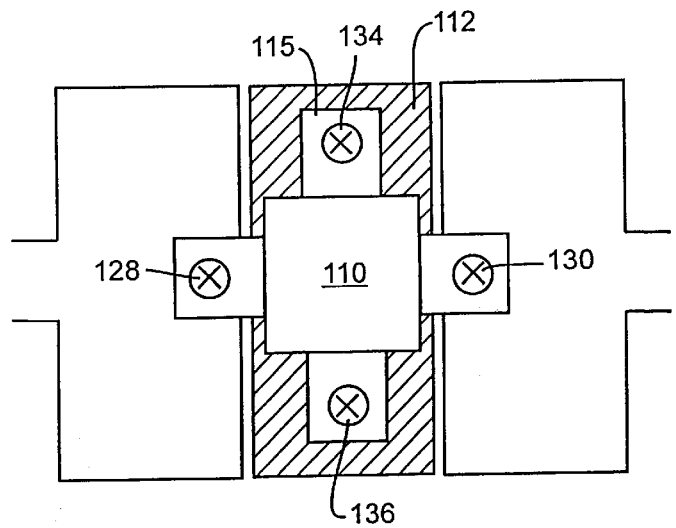
FIG. 8 is a top view of the IC package of FIG. 7, wherein a mounting flange underlying the IC package is independently secured to the heat sink.
Figure 9:
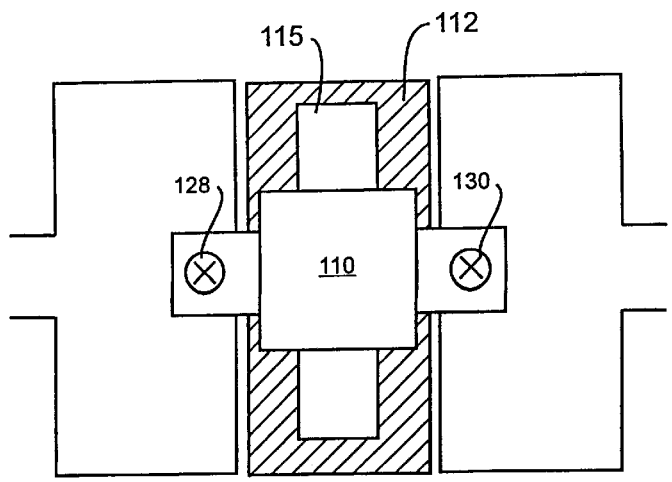
FIG. 9 is a top view of the IC package of FIG. 7, wherein the mounting flange underlying the IC package is not independently secured to the heat sink.

As seen in FIG. 8, the package mounting flange 115 may be independently secured to the heat sink 112 with conventional mounting screws 134 and 136. Alternately, as seen in FIG. 9, the package mounting flange 115 need not be independently secured to the heat sink 112, but instead is adequately secured by the lead connection screws 126 and 128—i.e., wherein the screws 126 and 128 are sufficiently tightened to maintain good thermal contact between the package flange 115 and heat sink 112.

Figure 10:
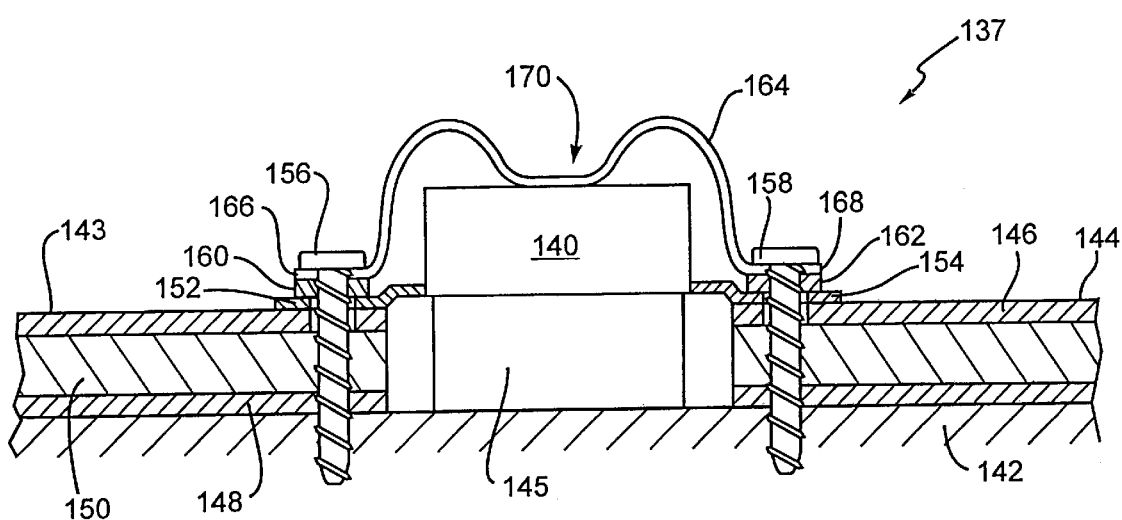
FIG. 10 is a partial cut-away side view of a second preferred electrical assembly, including an IC package secured to a heat sink in accordance with the present invention.

Referring to FIG. 10, as part of a second preferred electrical assembly 137, a mounting flange 145 underlying an power transistor package 140 is positioned on a heat sink 142 between first and second sections 143 and 144 of single layer PC board attached to the heat sink 142.

The respective PC board sections 143 and 144 each comprise a conductive metal top surface 146, a middle layer of dielectric material 150, and a conductive metal bottom surface 148, respectively, with the bottom surface 148 and attached heat sink 142 collectively acting as a reference ground with respect to circuit elements (not shown) attached to the conductive top surface 146.

The power transistor package 140 includes a first electrical lead 152 extending over the top surface 146 of the first PC board section 143, and a second electrical lead 154 extending over the top surface 146 of the second PC board section 144. The package leads 152 and 154 are electrically coupled with the conductive surface 146 of the respective PC board sections 143 and 144 by respective tie-down screws 156 and 158.

In particular, tie-down screw 156 is fastened through a first end 166 of a retaining spring 164, a first isolating washer 160, the first package lead 152 and the first PC board section 143, respectively, into the heat sink 142. The tie-down screw 158 is fastened through a second end 168 of the retaining spring 164, a second isolating washer 152, second package lead 154 and second PC board section 144, respectively, into the heat sink 142. Again, the isolating washers 160 and 162 are preferably made of a good thermal conductor, such as beryllium oxide or aluminum nitride, thereby allowing for heat from the package leads 152 and 154 to dissipate into the heat sink 142 via the respective screws 156 and 158.

The screws 156 and 158 are preferably tightened sufficiently against the retaining spring ends 166 and 168 so as to both secure the package flange 145 against the heat sink surface 142 via a force applied by the retaining spring 164 (as indicated by arrow 170), as well as to apply sufficient force against the isolating washers 160 and 162 to press the respective package leads 152 and 154 into solid electrical contact with the conductive top surface 146 of the respective PC board sections 143 and 144.

The package leads 152 and 154 and the conductive top surface 146 of the PC board sections 143 and 144 surrounding the respective screws 156 and 158 in assembly 137 are preferably cut-away to prevent electrical contact, in order to avoid shorting the leads 152/154 and/or the conductive top surface 146 to the heat sink 142 via the screws 156/158.

As with assembly 107, assembly 137 offers the elimination of solder connections between the package leads 152 and 154 and the conductive surface 116 of the PC board sections 143 and 144, as well as a means for securing the transistor package 140 to the heat sink 142. Further, the isolating washers 160 and 162, in conjunction with the respective screws 156/188 and package leads 152/154, act as capacitor (bridged by the retaining spring 164), which can help stabilize the power transistor package 140.

Thus, preferred embodiments have been disclosed of an improved mounting arrangement for securing a IC package to a heat sink. While embodiments and applications of this invention have been shown and described, as would be apparent to those skilled in the art, many more modifications and applications are possible without departing from the inventive concepts herein.

By way of one non-limiting example, means other than screws, such as, e.g., a clamp or a pin, may be used to press the package leads into electrical contact with the conductive surface areas of the adjoining PC board sections.

The scope of the invention, therefore, are not to be restricted except in the spirit of the appended claims.

What is claimed:

1. An electrical assembly, comprising:
  a heat sink;
  an integrated circuit package positioned on the heat sink, the integrated circuit package comprising
    a conductive mounting flange having a top surface and a bottom surface;
    an integrated circuit device attached to the top surface of the mounting flange;
    a conductive lead attached to, and extending from, the integrated circuit package, the lead being electrically coupled to the integrated circuit device and electrically isolated from the mounting flange,
  a circuit board attached to the heat sink adjacent the integrated circuit package the circuit board having a conductive surface lead; and
  a retaining screw secured to the heat sink through a portion of the package lead and the surface lead, the retaining screw having a screw head applying sufficient force on the package lead so as to electrically couple the package lead to the surface lead, as well as secure the bottom surface of the package mounting flange against the heat sink.

2. The electrical assembly of claim 1, further comprising a dielectric washer disposed between the retaining screw head and the package lead.

3. The electrical assembly of claim 2, wherein the dielectric washer, the retaining screw and the package lead form a capacitor having a capacitance that varies with the force exerted upon the dielectric washer by the screw head, whereby impedance matching between the package lead and the surface lead is facilitated.

4. The electrical assembly of claim 2, wherein the package lead has an opening through which the retaining screw extends, the opening sufficiently large so as to prevent electrical contact between the package lead and the retaining screw.

5. An electrical assembly, comprising:
   a heat sink;
   an integrated circuit package positioned on the heat sink, the integrated circuit package comprising
      a conductive mounting flange having a top surface and a bottom surface;
      an integrated circuit device attached to the top surface of the mounting flange;
      a first conductive lead attached to, and extending from, a first surface of the integrated circuit package, the first lead being electrically coupled to the integrated circuit device and electrically isolated from the mounting flange;
      a second conductive lead attached to, and extending from, a second surface of the integrated circuit package, the second lead being electrically coupled to the integrated circuit device and electrically isolated from the mounting flange;
   one or more circuit board sections attached to the heat sink adjacent the integrated circuit package, the one or more circuit board sections comprising a first conductive surface lead adjacent the first side of the mounting flange and a second conductive surface lead adjacent the second side of the mounting flange;
   a first retaining screw secured to the heat sink through a portion of the first package lead and the first surface lead, the first retaining screw having a first screw head applying sufficient force on the first package lead so as to electrically couple the first package lead to the first surface lead; and
   a second retaining screw secured to the heat sink through a portion of the second package lead and the second surface lead, the second retaining screw having a second screw head applying sufficient force on the second package lead so as to electrically couple the second package lead to the second surface lead;
   wherein the first and second retaining screws secure the bottom surface of the package mounting flange against the heat sink.

* * * * *